United States Patent [19]

Deleonibus

[11] Patent Number: 5,314,832
[45] Date of Patent: May 24, 1994

[54] PROCESS FOR THE PRODUCTION OF A HIGH VOLTAGE MIS INTEGRATED CIRCUIT

[75] Inventor: Simon Deleonibus, Claix, France

[73] Assignee: Commissariat a l'Energie Atomique, Paris, France

[21] Appl. No.: 835,106

[22] Filed: Feb. 12, 1992

Related U.S. Application Data

[63] Continuation of Ser. No. 585,599, Sep. 20, 1990, abandoned.

[30] Foreign Application Priority Data

Sep. 28, 1989 [FR] France .................. 89 12697

[51] Int. Cl.⁵ .................. H01L 21/266
[52] U.S. Cl. .................. 437/27; 437/44; 437/46; 437/189; 437/190; 437/200
[58] Field of Search .................. 437/190, 193, 200, 44, 437/27

[56] References Cited

U.S. PATENT DOCUMENTS 5,079,180  1/1992  Rodder et al. .................. 437/44
5,168,072 12/1992  Moslehi .................. 437/44

FOREIGN PATENT DOCUMENTS 60-117719  6/1985  Japan .................. 437/193
62-221158  9/1987  Japan .................. 437/44
1-265541 10/1989  Japan .................. 437/193
84/03587  9/1984  World Int. Prop. O. .......... 437/193

*Primary Examiner*—Olik Chaudhuri
*Assistant Examiner*—Ourmazd S. Ojan
*Attorney, Agent, or Firm*—Cesari and McKenna

[57] ABSTRACT

A process for the production of a high voltage, MIS integrated circuit or a substrate incorporating double implantation MIS transistors creates transistors whose sources and drains consist of double junctions and whose gates are formed in a semiconducting layer. The initial process includes a first implantation of ions of a given conductivity type in the substrate and at a given dose, in order to form there the first source and drain junctions, followed by a second implantation of ions of the same type as the first, at a higher dose than that of the first implantation in order to form the double junctions. The process is characterized in that between the first and second implantations, a conductive layer is epitaxied on said first junctions and on the gates, the second implantation being formed through the epitaxied layer in such a way that the double junctions are partly formed there.

17 Claims, 4 Drawing Sheets

PROCESS FOR THE PRODUCTION OF A HIGH VOLTAGE MIS INTEGRATED CIRCUIT

This application is a continuation of application Ser. No. 07/585,599, filed Sept. 20, 1990, now abandoned.

The present invention relates to a process for the production of an integrated circuit with standing high supply voltages and incorporating double implanted MIS transistors. It more particularly applies to the field of integrated circuits of the nMOS, pMOS, CMOS and BICMOS types and more specifically to integrated circuits, whereof the widths of the gates of the transistors are less than 1 micrometer and even less than 0.2 micrometer. These submicron circuits are, in particular, microprocessors, microcontrollers, memories, specific application circuits (ASIC), etc.

BACKGROUND OF THE INVENTION

With the reduction of the critical dimensions of integrated circuits and, more particularly, the width of the gate of MIS transistors, it has proved necessary to modify the construction processes for the sources and drains of said transistors.

Thus, the smaller the gate width, the greater the lateral diffusion of the source-drain implantation beneath the gate becomes, so that it is more disadvantageous. In addition, the MIS transistor may become more sensitive to the puncturing phenomenon between the source and the drain corresponding to the leakage current between the source and the drain for a zero gate voltage. Finally, the reduction of said gate width leads to a premature ageing of the MIS transistor through the injection of hot carriers into the gate insulant. This phenomenon becomes more prejudicial as the concentration of the dopants at the edges of the transistor gate becomes high.

For all these reasons, type n and also type p transistors are now produced by a double implantation process, referred to as the low doped drain or LDD process and which solves the aforementioned problems for technologies in which the gate width is typically below 2 micrometers. This process becomes absolutely indispensable in submicron technologies.

This overall process is more particularly described in the IBM EP-A-0 054 117. It essentially consists of forming the gate of the transistors in a polycrystalline silicon film, thermally oxidizing the substrate and the gate of the transistors, carrying out a first low dose implantation, forming spacers on either side of the transistor gate and then carrying out a second high dose implantation in order to form the double junction sources and drains of the transistors.

The first low does implantation makes it possible to considerably reduce the dopant concentration perpendicular to the gate of the transistors and therefore partly solve the aforementioned electrical problems. The second high dose implantation is necessary for fulfilling the function of the source and drain of the transistors, because the resistance of the junctions obtained by the low dose implantation is too high.

In order to ensure that said high dose implantation is not superimposed on the low dose implantation zone, it is necessary to move it physically away from the edge of the gate. This is brought about by carrying out the second implantation through spacers or spacing strips. These spacing strips are obtained by the isotropic deposition of an insulating film on the complete structure, followed by the full plate etching of said insulating film in order to form the spacers on the gate edges.

During the production of the spacers, there is generally a large consumption (several dozen nm) of the field insulant (generally field oxide) used for the electrical insulation of the transistors. This field insulant consumption modifies its electrical properties, which can favor the formation of parasitic transistors in said insulations.

Moreover, the aforementioned IBM process does not make it possible to obtain MIS integrated circuits operating with a high supply voltage. Moreover, the transistors obtained have a low transconductance. The term high supply voltage is understood to mean voltages of 8 V for transistor gate widths of 500 nm, a voltage of 5 V for gate widths of 300 nm and a voltage of 3 V for gate widths below 200 nm.

In order to obviate these disadvantages, R. IZAWA et al proposed a modification to the IBM process described in the IEDM article 87, pp 38–41 "The impact of gate-drain overlapped LDDD (GOLD) for deep submicron VLSI'S". In this process, successive formation takes place on the thermal oxidant of the substrate of a first polycrystalline silicon coating, a second thermal oxide and a second polycrystalline silicon coating. This is followed by the etching through an insulating mask of said second polycrystalline silicon coating and then the first low dose implantation into the substrate through the second thermal oxidation coating, the first polycrystalline silicon coating and the first thermal oxidation coating. Following the low dose implantation, spacers are formed by the deposition of a second oxide coating on the complete structure and then the full plate etching of said oxide coating.

By using the spacers as a mask, an etching takes place of the first polycrystalline silicon coating, followed by an oxidation of the etched edges of said first silicon coating. Only then does the high dose second implantation take place.

The use of a first polycrystalline silicon coating permits an overlap of the transistor gate over the weakly implanted source and drain areas, thus reducing the electrical resistance of said low implantation areas. Moreover, this process makes it possible to increase the transconductance of the transistors, as well as the current in their channel.

Unfortunately, the transistors obtained have an inadequate resistance to puncturing between the source and the drain, thus limiting the supply voltage applied to said transistors. The limited puncturing resistance of "GOLD" transistors is due to the fact that n+pn+ or p+np+ transistors are buried beneath the channel of the, respectively, n−pn− and p−np− transistors.

In addition, this process suffers from performance difficulties. More particularly, the etching of the second polycrystalline silicon coating requires a selectivity higher than 100 relative to the second silicon oxide coating, bearing in mind the limited oxide coating thickness necessary for avoiding the obtaining of a floating gate, which is difficult to carry out with the etching procedures used.

SUMMARY OF THE INVENTION

This invention is directed at a novel process for the production of a MIS integrated circuit able to withstand high supply voltages and having double implantation transistors making it possible to obviate the disadvantages referred to hereinbefore. In particular, this process makes it possible to produce transistors with a submicron gate width, namely below 200 nm, which have a better puncturing resistance than the prior art transistors.

Moreover, this process is relatively simple to perform and has no critical stage. In particular, it makes it possible to produce contacts overlapping the sources and drains of the transistors without using artifices such as the implantation of ions in the contact holes and which were necessary in the prior art processes.

More specifically, the present invention relates to a process for the production of an integrated circuit on a semiconductor substrate having MIS transistors, whose sources and drains consist of double junctions and whose gates are formed in a semiconducting layer, comprising a first implantation of ions of a given conductivity type in the substrate and at a given dose, in order to form there the first source and drain junctions, followed by a second implantation of ions of the same type as the first, at a higher dose than the of the first implantation in order to form said double junctions, said process being characterized in that between the first and second implantations, a conductive layer is epitaxied on said first junctions and on the gates, the second implantation being formed through said epitaxied layer in such a way that the double junctions are partly formed there.

The term conductive layer is understood to mean a conductive layer in the true sense of the term, but also a semiconducting layer. In particular, in a technology on silicon, said conducting layer can be a n or p doped, polycrystalline silicon layer as a function of the transistor type to be produced, a layer of a silicide of a transition metal such as cobalt silicide or titanium silicide, or a partly surface silicided, doped silicon layer.

The epitaxy of a conductive layer on the gates leads to a certain number of advantages. In particular, it permits a high dose implantation of the gates in self-aligned manner at the same time as a high dose implantation of the sources and drains; it permits an improvement to the interconnection of the gates, while reducing the connection resistance, it permits both time and production cost savings by reducing the risk by reducing stages the required number of compared with the prior art.

The MIS transistors obtained by the process according to the invention also have a better puncturing resistance than those obtained by the aforementioned IZAWA process as a result of the use of the epitaxied conductive layer suspending the high implantation n+ or p+ regions with respect to the source and drain regions above the level of the channel of the transistors. The effective junction depth in the substrate then decreases and there is no longer a buried n+pn+ or p+p+, parasitic, bipolar transistor in parallel with the n−pn− or p−np− bipolar transistor.

Although the invention is applied with particular advantage to a technology on silicon, it is also applicable to a technology on GaAs, InP or HgCdTe.

Preferably, the process according to the invention comprises the following successive steps:

a) production of the lateral electrical insulations of the transistors, b) deposition of a layer of a first insulant at least between the lateral insulations, c) deposition, on the structure obtained in step b), of a semiconducting layer, which can be selectively doped and etched with respect to the lateral insulations, the first insulant and the insulating spacing strips, d) production, on the first semiconducting layer, of a mask of at least one material which can be selectively etched with respect to the lateral insulations, the first insulant, the semiconducting layer, a second insulating material and said spacing strips, masking the gates of the transistors to be produced in the semiconducting layer, e) first implantation of ions in the semiconducting layer and in the substrate, which are not masked, in order to form the first source and drain junctions of the transistors, f) production of said spacing strips on the mask edges, g) etching of the semiconductor layer in order to eliminate therefrom the regions not covered by the mask and the spacing strips thus forming the gate of the transistors, h) insulation of the etched edges of the semiconducting layer with the second insulant, i) elimination of the mask, j) elimination of the regions of the first insulant bared during step g), k) epitaxy of a conducting layer on the source and drain regions bared during step j) and on the gate of the transistors, l) second implantation of ions in the epitaxied conductive layer and in the source and drain regions, m) production of the electrical connections of the integrated circuit, The term lateral insulation is understood to mean both a surface insulation of the field oxide type and a depth insulation by insulation trenches.

The MIS transistors obtained according to the process of the invention are able to withstand high supply voltages (e.g. 5 V for gate widths of 300 nm). Thus, in the same way as in the IZAWA GOLD structure, the electrical field created in the vicinity of the channel is weak as a result of the gradual doping obtained beneath the gate of the transistors. This makes it possible to increase the avalanche voltage of the drain diode and ensure a better reliability of the component when high voltages are applied to its drain.

Moreover, the etching of the semiconducting layer to form the gates of the transistors following the production of the spacing strips, ensures a protection of the lateral insulations during the production of the spacing strips. This protection is of particular interest when the lateral insulations and the spacing strips are produced from the same material, e.g. silicon oxide.

In known manner, the spacing strips are formed by the isotropic deposition of an insulating layer on the complete structure, followed by selective, anisotropic etching of said layer. In this context, the etching of the semiconducting layer to form the gates, following the production of the spacers, makes it possible to use said semiconducting layer as an etching stop layer for the spacers. Moreover, said semiconducting layer protects the source and drain regions at the end of the etching of the spacers (the etching of the spacers in the prior art stopping in the semiconducting substrate). This then makes it possible to eliminate the cleaning stage used in the prior art for eliminating the etching residues of the spacers on the active areas and thus obviate any risk of contaminating said areas during the said etching stage.

Advantageously, a conductive material is deposited between stages l) and m) of the aforementioned process and this takes place in selective manner on the epitaxied conductive layer with respect to the spacing strips, the lateral insulations and the second insulant, in order to form the shunts of the gates, sources and drains.

The order of the stages in the process according to the invention makes it possible to form the gate shunts at the same time as the source and drain shunts.

The production of the shunts on the sources, drains and gates of the transistors prior to the production of their electrical contacts, makes it possible to provide a good protection of the source and drain diodes on the edge of the lateral insulations. In particular, these shunts make it possible to produce electric contacts overlapping the source and drain regions without any special stage. Moreover, these shunts improve the electrical contacts of the connections of the circuit on the source and drain areas, as well as on the transistor gates, thus facilitating the formation of the said contacts.

As a result of these shunts, it is possible to produce the electrical connections of the integrated circuit by depositing an insulating layer on the complete structure obtained in 1) after the production of said shunts and then forming contact holes in said insulating layer facing the gates, sources and drains to be connected, followed by the selective deposition of a conductive material in the contact holes with respect to the insulation layer. In this embodiment, the use of shunts on the sources and drains serves as a "nucleus" for the growth of the conductive material layer selectively deposited in the contact holes.

Obviously, it is also possible to deposit said conductive material on the complete insulating layer and etch said material in accordance with a given profile to obtain these connections.

The conductive materials used for constituting the shunts of the sources, drains and gates of the transistors, as well as the integrated circuit connections are, in particular, low temperature deposited tungsten (approximately 250° to 450° C.), using low pressure chemical vapor phase deposition (LPCVD).

The selection deposition of tungsten for producing the interconnections of an integrated circuit is in particular described in the article by V. V. Lee et al, IEDM 88, pp 450-453; "A selective CVD tungsten local interconnect technology".

According to the invention, it is also possible to obtain the interconnections of the integrated circuit and the source, drain and gate shunts of the components by doped silicon epitaxy, by LPCVD deposition of silicide of a transition metal such as $CoSi_2$ or $TiSi_2$ or by electrophoresis of metals such as platinum, palladium or copper.

According to the invention, the mask used for masking the gates of the transistors to be produced can be constituted by one or two material layers and the layer formed directly on the semiconducting layer in which will be produced the transistor gates, must be suitable for selective etching with respect to the lateral insulations, the first insulant, said semiconducting layer, the second insulant and the spacing strips. In particular, the material directly in contact with the semiconducting layer is of silicon nitride when the first insulant, the second insulant, the spacing strips and the lateral insulations are of silicon oxide and when the semiconducting layer is of polycrystalline silicon.

For the first insulant, second insulant, lateral insulations and spacing strips of silicon nitride, the material formed directly on the layer intended for the gates is silicon oxide. In a two-layer stack, the upper layer is of $SiO_2$ when the lower layer is of $Si_3N_4$ and vice versa.

Advantageously, the structure is annealed at a temperature between 800° and 1000° C. in silicon technology, following the second implantation, in order to diffuse the implanted ions into the substrate and the epitaxied conductive layer, as well as to activate them. When the stages of producing the integrated circuit following the second implantation are carried out at high temperature (above 800° C. for silicon), it is possible to eliminate said annealing stage. An example of a high temperature stage is the production of the insulating layer of the electrical connections.

BRIEF DESCRIPTION OF THE DRAWINGS

The invention is described in greater detail hereinafter relative to non-limitative embodiments and with reference to the attached drawings, wherein show.

DESCRIPTION OF THE PREFERRED EMBODIMENTS

The following description relative to the drawings relates to the production of double implantation, n channel, MOS transistors in a type p silicon substrate. Obviously and as stated hereinbefore, the invention has much more general applications and in particular applies to p channel transistors and to the production of CMOS circuits having n channel transistors and p channel transistors integrated onto the same substrate, as well as BICMOS circuits having in addition bipolar transistors.

Figure 1A:
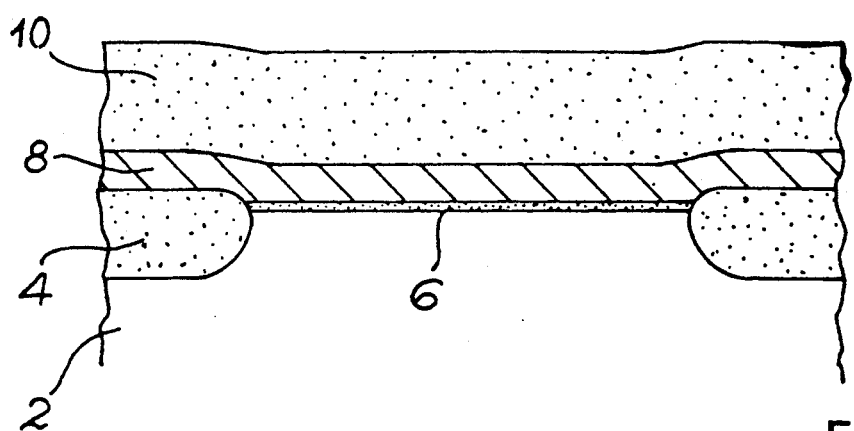
FIGS. 1A to 1H diagrammatically and in longitudinal section, the different stages of the process according to the invention.

In known manner and as shown in FIG. 1A, on the type p, monocrystalline silicon substrate 2 is firstly formed a field oxide 4 by local thermal oxidation of the substrate using the LOCOS process. This field oxide 4 issued for electrically insulating the different active components of the integrated circuit and has a thickness of approximately 600 nm.

Between the field oxide 4 is then formed a silicon oxide film 6, which will serve as the gate oxide for the transistors. This gate oxide is obtained by thermal oxidation of the substrate and has a thickness of 25 to 30 nm.

This is followed by the deposition on the complete structure of an intentionally undoped, polycrystalline silicon layer 8. The latter is, in particular, obtained by low temperature vapor phase chemical deposition and has a thickness of 50 to 100 nm. This is followed by the deposition of a 300 nm thick, silicon nitride layer 10 by vapor phase chemical deposition (CVD).

Figure 1B:
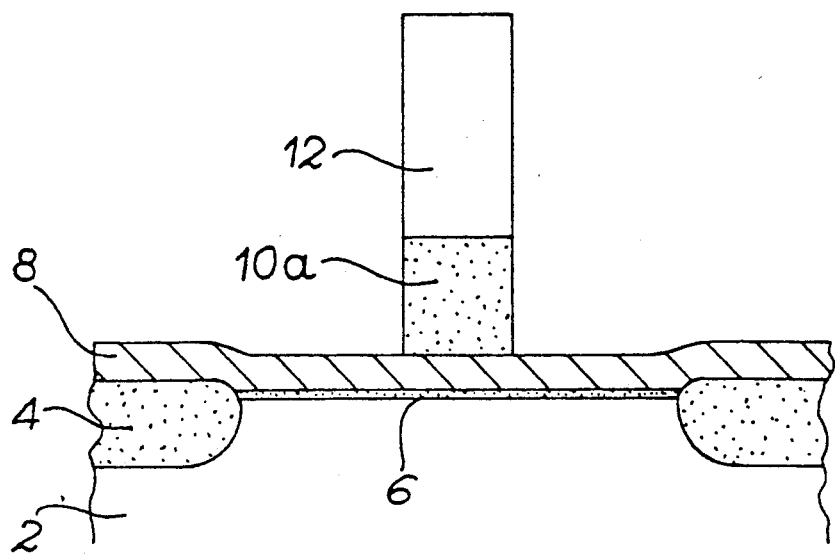

As shown in FIG. 1B, this is followed by the formation of a positive photolithographic mask 12 ensuring the masking of the gate of the transistors to be produced in the silicon layer 8. This is followed by the etching of the layer 10 over its entire thickness stopping in the silicon layer 8. Thus, the latter serves as an etching stopping layer and as a buffer layer between the oxide film 6 and the layer 10.

This etching is carried out selectively with respect to the silicon layer 8 using a reactive ionic etching method. The reactive gas is e.g., a mixture of $CHF_3$, $C_2F_6$. This gives an etching and implantation mask 10a, which ensures the self-alignment of the low and high dose junctions with respect to the gates of the transistors and the spacers.

Figure 1C:
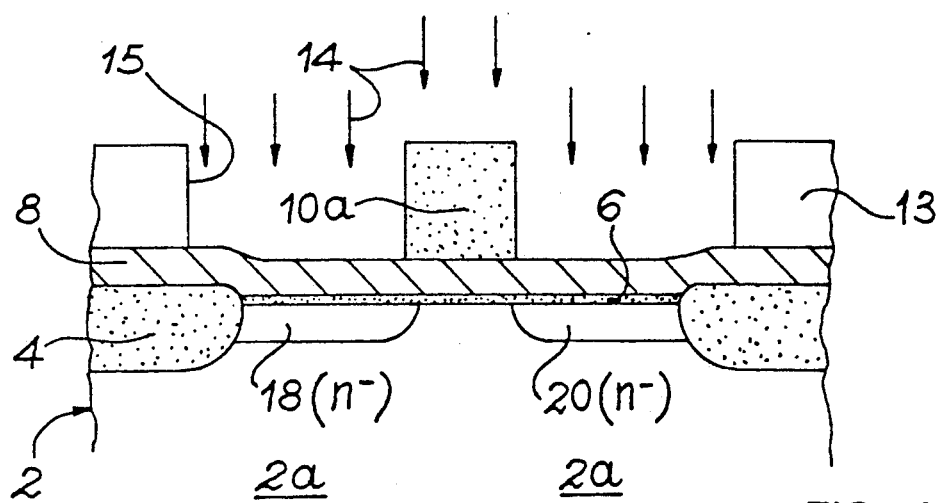

Prior to the elimination of the resin mask 12 by oxygen plasma, as shown in FIG. 1C in the case of producing the integrated circuit with different transistor types, a new lithographic resin mask 13 is formed defining the location of the source and drain of the transistors of a given type. To this end, the mask has openings 15 facing the substrate region 2a in which the transistors are to be produced. Within the scope of CMOS circuits, said mask 13, in particular, serves to mask the regions of the substrate intended for the pMOS transistors.

This is followed by a first, low dose, n- type, ionic implantation 14 in the unmasked substrate regions 2a, followed by a high dose implantation in the silicon layer 8 using the masks 13 and 10a as the implantation mask.

The n- implantation in the substrate can be carried out with phosphorus or arsenic at doses of $1 \times 10^{12}$ to $5 \times 10^{13}$ ions/cm$^2$ at energies of 50 to 100 keV. The high dose, n+ implantation in the silicon layer 8 can also be carried out with phosphorus or arsenic at doses of $1 \times 10^{14}$ to $1 \times 10^{15}$ ions/cm$^2$ (i.e. 20 to 100 times higher doses) and at energies of 10 to 25 keV. As the implantation energies are directly linked with the implantation depth, the doping of the layer 8 is carried out with lower energies than those used for doping the substrate, e.g. 4 to 5 times lower.

The low dose implantation in the substrate regions 2a ensures the formation of first source 18 and drain 20 junctions of the transistors, said sources and drains being of the n— type. This is followed by the elimination of the resin mask 13 by oxygen plasma.

Within the framework of a CMOS circuit, this is followed by the production of another implantation mask masking the n channel transistors produced and having openings facing the p channel transistors to be produced with a view to carrying out a p— type, low dose implantation in the substrate and a p+, high dose implantation in the silicon layer 8.

The p— implantation can be carried out with boron or BF$_2$+ ions at the same doses as those used for the n— implantation, but using energies of 10 to 70 keV. This is followed by a p+ implantation in layer 8 with boron or BF$_2$+ ions at the same doses as the n+ implantation in the layer 8, but at energies of 10 to 50 keV. As for the n channel transistors, these p— and p+ implantations are carried out using, besides the lithographic resin mask, a silicon nitride mask produced at the same time as the mask 10a and masking the channel of the transistors in the same way as the mask 10a. This resin mask is removed following the p+ implantation of the layer 8.

Figure 1D:
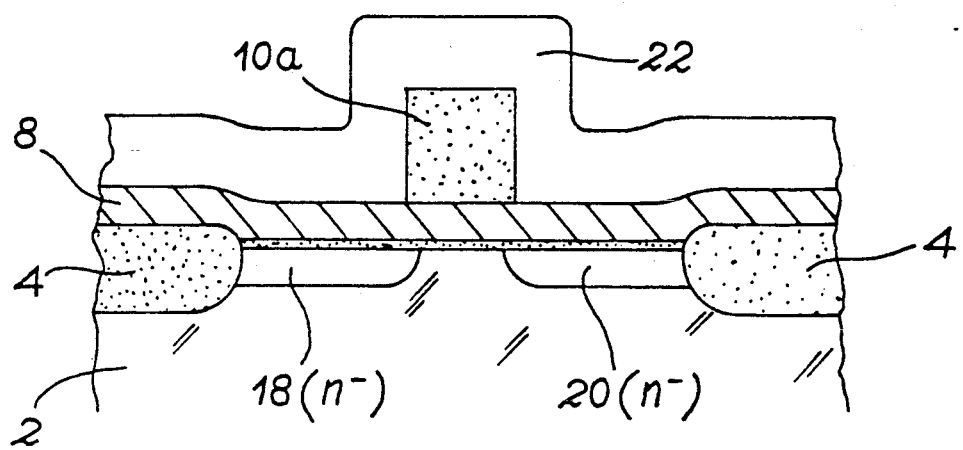
Figure 1E:
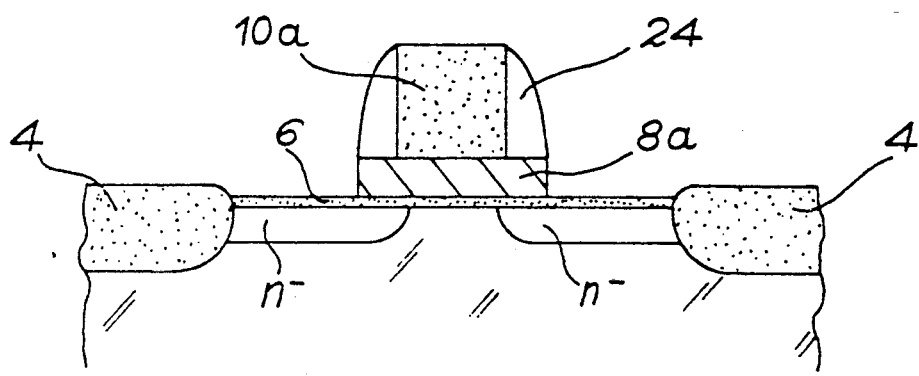

The first high dose implantation of the silicon layer 8 makes it possible to ensure a doping thereof up to the silicon-oxide interface 8-6 of the gate and particularly beneath the spacing strips or spacers which are subsequently produced (FIG. 1E). This high dose doping of the layer 8 also makes it possible to ensure a good high frequency operation of the transistors.

This is followed by the deposition on the entire structure obtained of an insulating layer 22 which is to be selectively etched with respect to the silicon layer 8. This layer 22 is, in particular, a silicon oxide layer deposited by low pressure, vapor phase chemical deposition (LPCVD), which ensures the homogeneity of the thickness of the layer 22. The thickness is 100 to 200 nm. This gives the structure shown in FIG. 1D.

This is followed by an anisotropic etching of the oxide layer 22, the silicon layer 8 serving as an etching stopping layer. This etching is of the full plate etching type (i.e. without a mask). It is performed in the reactive ionic mode using a trifluoromethane or tetrafluoromethane plasma in exemplified manner.

Thus, on the edges of the mask 10a are obtained insulating strips or borders 24 serving as spacers and as shown in FIG. 1E. These spacers 24 are voluntary residues resulting from excess oxide thicknesses on the edges of the mask 10a.

Figure 2:
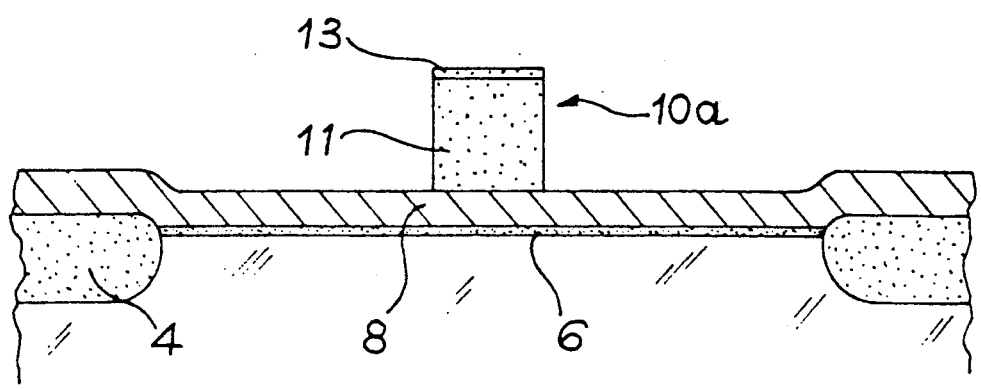
FIGS. 2 and 3 a variant of the process according to the invention.
Figure 3:
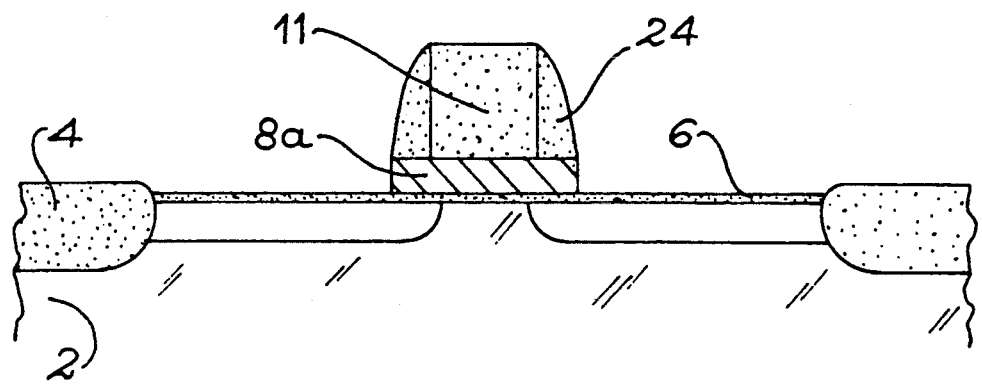

In order to keep the mask 10a intact during the etching of the spacing strips 24, it is possible to use a two-layer etching mask 10a. This variant is shown in FIGS. 2 and 3. To this end, during the deposition of the layers for forming the mask 10a, there is a successive deposition of a 300 nm, Si$_3$N$_4$ layer 11 directly onto the semiconducting layer 8 by LPCVD and a 30 nm, SiO$_2$ layer by vapor phase chemical deposition by pyrolysis of tetraethyl orthosilicate (TEOS) or at low temperature (LTO).

The two-layer etching mask 10a (FIG. 2) is produced, as hereinbefore, by reactive ionic etching using a trifluoromethane or tetrafluoromethane plasma for the upper SiO$_2$ layer 13 and a mixture of CHF$_3$,C$_2$F$_6$ for the lower Si$_3$N$_4$ layer.

Due to the fact that the upper layer 13 is of a material of the same nature as that used for the spacers 24, the upper layer 13 is eliminated during the etching of the spacers 24 (FIG. 3).

As shown in FIG. 1E, the following stage of the process consists of etching the semiconducting layer 8, so as to eliminate therefrom the regions not covered by the mask 10a, but also by the spacers 24. This gives the transistor gate 8a.

This etching must be selective with respect to the spacing strips 24, the lateral insulation 4 and the oxide 6, the latter also serving as an etching stopping layer. This etching of the layer 8 can be carried out in a reactive ionic manner using a sulphur hexafluoride plasma for a silicon layer, said etching type having high anisotropy characteristics. The etching of the silicon layer following the production of the spacers makes it possible to avoid a surface etching of the field oxide 4.

This is followed by a reoxidation of the source and drain regions of the transistors more particularly leading to the lateral oxidation of the silicon transistor gate 8a. The oxide layer formed has a thickness of 10 to 20 nm.

Figure 1F:
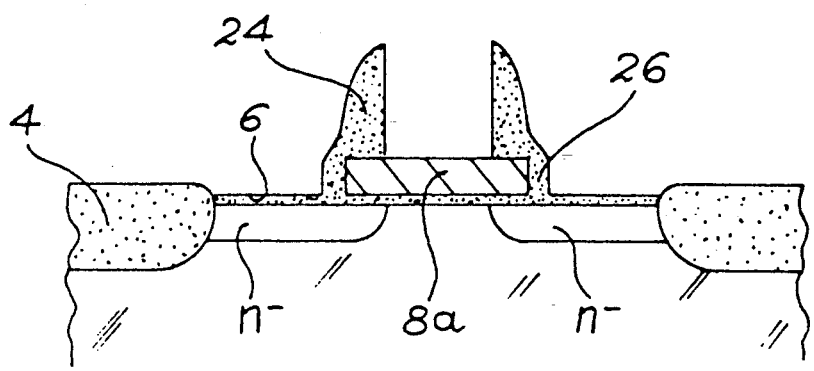

As shown in FIG. 1F, this is followed by the elimination of the mask 10a in selective manner with respect to the spacers 24, the insulants 4, 6 and 26 and the gates 8a. For a silicon nitride mask, more particularly, use is made of hot orthophosphoric acid for said elimination.

Figure 1G:
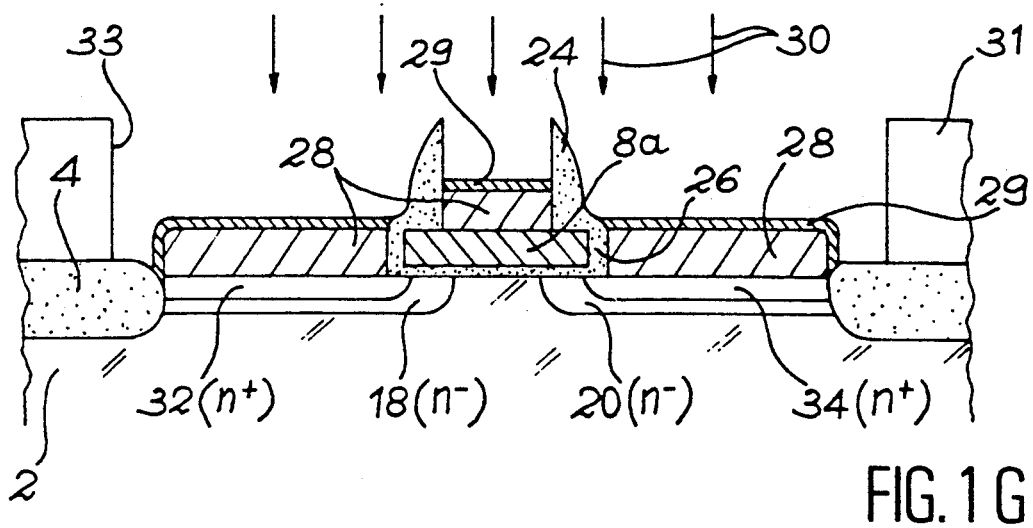

As shown in FIG. 1G, the next stage of the process consists of eliminating by anisotropic etching the regions of the oxide 6 bared during the etching of the silicon layer 8.

This elimination is carried out by dry anisotropic etching with etching stopping by the silicon substrate. This etching is carried out selectively with respect to the silicon, using e.g. trifluoromethane or tetrafluoromethane. This elimination of the oxide above the source and drain regions leads to a slight erosion of the spacers 24 and the field oxide (a few nm), which is not prejudicial to the subsequent operation of the transistors and to their subsequent production stages.

Following an appropriate cleaning of the exposed silicon surfaces (i.e. the source, drain and gate regions of the transistor), epitaxy is carried out of a conductive layer 28 in selective manner on the source and drain regions and on the gates 8a with respect to the field oxide 4, the spacers 24 and the lateral insulation 26 of the gates 8a. The thickness of layer 28a is approximately 100 nm. It is, in particular, constituted by silicon with a high defect density, i.e. quasi-amorphous or having micro-crystallines, so as to aid the formation of fine junctions, during the subsequent implantation, accompanied by a good control of the depth of the junctions. The epitaxy of the silicon is obtained as a result of thermal decomposition of the SiH$_4$.

Advantageously, it is possible to partly or totally silicide the silicon layer 28. As shown in FIG. 1G, a partial siliciding makes it possible to obtain a surface layer 29, which makes it possible to reduce the contact resistance between the layer 28 and the circuit connections. The said layer 29 is obtained by self-aligned siliciding on the source, drain and gate regions using transition metals such as titanium or cobalt.

This siliciding consists of depositing a metallic layer of Ti or Co on the layer 28 and heating the structure obtained at between 500° and 800° C., so that the metal reacts chemically with the underlying silicon and this is followed by the selective elimination of the metal deposited anywhere other than on the layer 28.

This is followed by an ion implantation 30 in the layers 28, 29, but also in the underlying source and drain regions and in the gates 8a. This is a high dose implantation, i.e. the dose is 10 to 50 times higher than that of the low dose implantation of the source and drain regions. In particular, implantation takes place of phosphorus or arsenic ions at doses of $5 \times 10^{14}$ to $5 \times 10^{15}$ ions/cm$^2$ with an energy of 15 to 80 keV.

As hereinbefore, said n+ implantation is carried out with a mask 31, identical to the mask 13 and having openings 33 facing the n channel transistors to be produced and masking the remainder of the circuit and, in particular, the regions in which are to be produced the p channel transistors for the CMOS integrated circuits.

In such a circuit, following the elimination of the mask 31, there is a p+ implantation in the p channel transistors using a mask similar to the mask 31 and having openings facing the p channel transistors and then masking the n channel transistors produced. This p+ high dose implantation is, in particular, carried out with boron or BF$_2^+$ ions at an energy of 10 to 60 keV and doses identical to those used for the n+ implantation.

The high dose implantation 30 is carried out using, besides resin masks, spacers 24 and lateral insulations 26 of the gates 8a as a mask, thus making it possible to physically space the n+ (respectively p+) source and drain 32, 34 regions from the channel of the transistors.

The last ions implanted are essentially located in the epitaxied silicon layer 28 and the silicide layer 29. Thus, in order to ensure a diffusion of these ions into the substrate with a view to obtaining the type n source and drain regions 32, 34 respectively, as well as into the gate 8a of the transistors, together with an activation of the implanted ions, the structure obtained is annealed. This annealing is carried out either in a furnace at 900° C. for about 20 or 30 minutes in a nitrogen atmosphere, or by fast annealing using lamps. During the implantation annealing, the implanted, epitaxied layer 28 serves as a doping source for the gates and the source and drain regions of the transistors.

As a result of the high dose implantation through the layers 28 and 29 according to the invention and the annealing following said implantation, n+ (respectively p+) areas are obtained, which are physically embedded in the n— (respectively p—) areas and which are suspended above the level of the channel of the transistors located level with the n— (respectively p—) regions of the transistors.

In addition, as a result of the epitaxied layer 28 serving as a doping source, there is obtained a better avalanche behavior or resistance of the drain diode of the transistors, in the same way as in the aforementioned GOLD structure, but also a better puncturing resistance than in the case of said GOLD structure transistors.

Figure 1H:
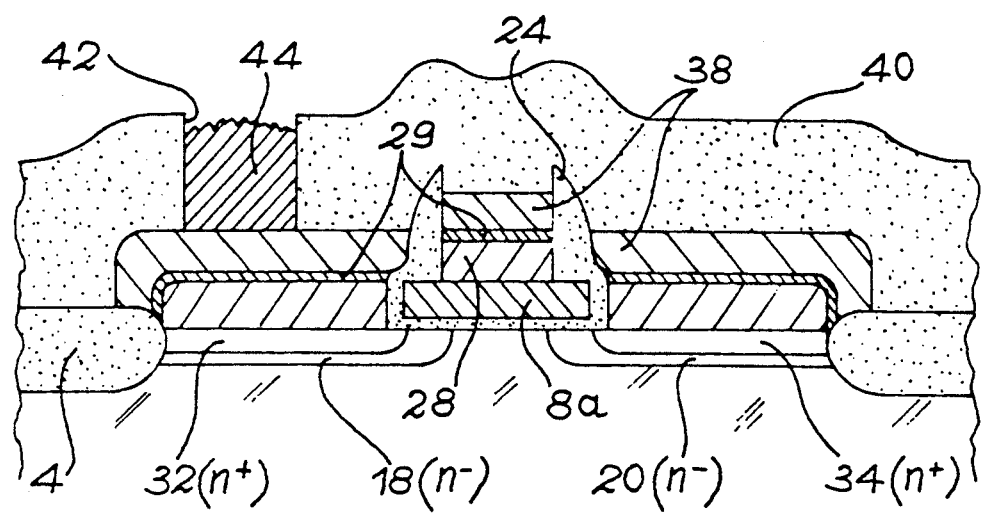

The following stage of the process consists of depositing in selective manner, a conductive layer 38 on the silicide layer 29 with respect to the spacing strips 24 and as shown in FIG. 1H, which makes it possible to produce gate, source and drain shunts for each transistor. This conductive layer 38 is in particular of tungsten deposited at low temperature by LPCVD, by decomposition of WF$_6$ and SiH$_4$, as described in the aforementioned article by V. V. Lee. This conductive layer 38 has a thickness of approximately 100 nm. The gate, source and drain shunts obtained have a low resistance of approximately 0.5 to 2 Ohm$^2$. The thus obtained MOS transistors can withstand high supply voltages and in particular of 5 V for the 300 nm wide gates 8a.

Following the selective deposition of the conductive material 38, there is a deposition of insulating material 40 and, in particular, silicon oxide on the complete structure. A smoothing by flow or creep of said layer 40 can optionally be carried out in order to level out the step passage of the subsequent metallization of the gates and interconnections of the source and drain regions of the transistors of the integrated circuit.

In order to ensure the metallization of the gates 8a and produce the circuit interconnections, openings 42 are formed in the insulating layer 40 by reactive ionic etching using an appropriate mask, the layer 38 serving as a stop layer for said etching. This is followed by the filling of the contact holes 42 with the aid of a conductive material 44. The presence of the conductive layer 38 facilitates contacting at the bottom of the contact holes 42. Moreover, the shunt layer provides a good germ or nucleus for the growth of the metallization layer 44.

The conductive layer 44 is, in particular, selectively deposited in the same way as the conductive layer 38. The material 44 can be of silicide formed by local siliciding of the layer 38 or a metal. In the latter case, use is, in particular, made of tungsten deposited at low temperature by LPCVD and as described in the aforementioned article by V. V. Lee.

Figure 4:
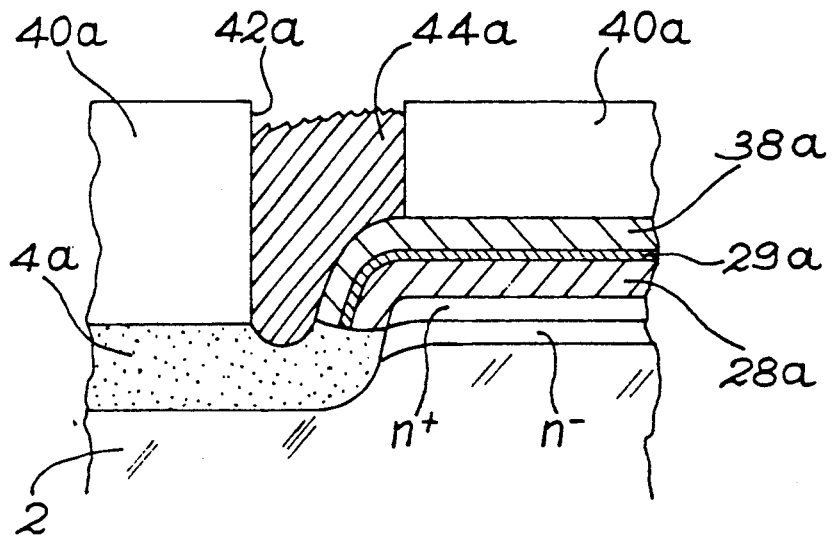
FIGS. 4 and 5 limit positions of the transistor connections obtained by the process according to the invention.
Figure 5:
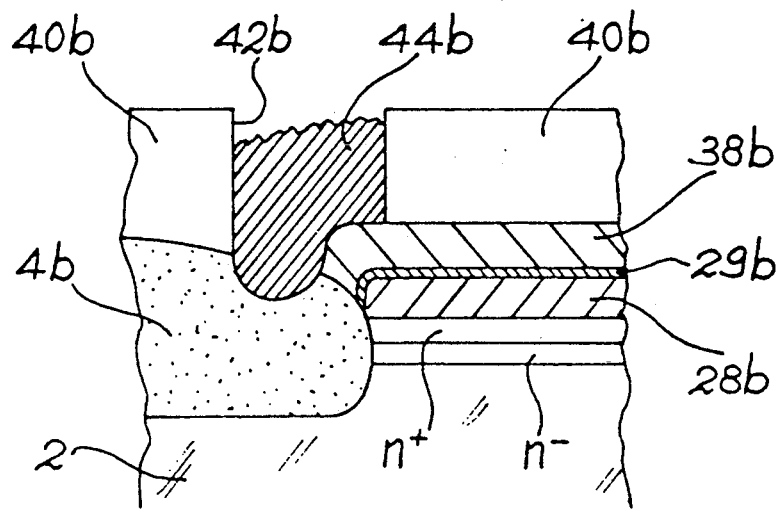

FIGS. 4 and 5 show the extreme electrical contacting conditions on the source and drain regions of the transistors using the process according to the invention. In FIGS. 4 and 5, the circuit elements carry the same references as hereinbefore, followed by the letters a and b respectively.

In these extreme situations, electric contact is ensured via epitaxied silicon 28a, 28b, silicide 29a or 29b and shunt 38a or 38b layers. Thus, the shunt layers 38a perfectly adapt to the contours of the layer 29a and consequently those of the conductive layer 28a, which thus constitutes a good protection for the source and drain diodes on the border of the field oxide 4a or 4b.

Moreover, the stacking of said layers makes it possible to produce overlapping contacts 44a and 44b, without having to use a supplementary stage and, in particular, an ionic implantation within the contact holes 42a and 42b, respectively, formed in the insulating layer 40a and 40b.

The description given hereinbefore is obviously not given in a limitative manner and numerous modifications can be made without passing outside the scope of the invention. In particular, the nature of the different layers, their deposition procedure and their etching procedure can be modified. Moreover, certain layers can be eliminated without affecting the properties of the transistors obtained, more particularly with respect to the shunt layer 38. When the latter is absent, the overlapping contacts (FIGS. 4 and 5) will be slightly more difficult to produce.

I claim:

1. A process for producing an integrated circuit on a semiconductor substrate having MIS transistors, whose sources (18,32) and drains (20,34) consist of double junctions and whose gates (18a) are formed in a semiconductive layer (8), said process comprising the following successive steps:
   a) producing lateral electrical insulations (4) of the transistors,
   b) forming a layer of a first insulant (6) at least between the lateral insulations, said first insulant constituting the insulant for the gates (18a) to be formed in the semiconducting layer (8),
   c) depositing, on the structure obtained in step b), said semiconductive layer (8), which can be selectively doped and etched with respect to the lateral insulations, the first insulant and insulating spacing strips (24),
   d) producing, on the semiconductive layer, a mask (10a) of at least one material which can be selectively etched with respect to the lateral insulations, the first insulant, the semiconductive layer, a second insulating material (26) and said spacing strips (24), thereby masking the gates (8a) of the transistors to be produced in the semiconductive layer,
   e) performing a first implantation (14) of ions at a low dose in the semiconductive layer (8) and in the substrate (2), which are not masked, in order to form in the substrate first source (18) and drain (20) junctions of the transistors, said ions having a conductivity type,
   f) producing said spacing strips (24) only on the mask (10a) edges,
   g) etching the semiconductive layer (8) in order to eliminate therefrom the regions not covered by the mask and the spacing strips, thus forming the gates (8a) of the transistors,
   h) insulating (26) the etched edges of the semiconductive layer with the second insulant,
   i) eliminating the mask (10a),
   j) eliminating the regions of the first insulant bared during step g),
   k) epitaxy of a conductive layer (28a, 28b) only on the source (18) and drain (20) regions bared during step j) and on the gates (8a) of the transistors,
   l) depositing an intermediate conductive layer (29a, 29b) on said epitaxied layer in a selective manner with respect to the spacing strips, the lateral insulations and the second insulant,
   m) performing a second implantation (30) of ions in the epitaxied conductive layer and in the source and drain regions in order to form said double junctions partly in the epitaxied layer and partly in the substrate, said ions having the same conductivity as the ions of the first implantation and said second implantation being made at a higher dose than that of the first implantation,
   n) depositing a conductive material (38a, 38b) on the intermediate conductive layer in order to obtain at the end of the process overlapping electrical contacts (44a, 44b) on said source and drain junctions, said conductive material being deposited in a selective manner with respect to the spacing strips, the lateral insulations and the second insulant, in order to form gate, source and drain shunts,
   o) depositing on the complete structure obtained in step n) an insulating layer (40a, 40b),
   p) forming contact holes (42a, 42b) in said insulating layer facing the gates (8a), the sources (18, 32) and the drains (20, 34) to be connected, and
   q) depositing a conductive material 44a, 44b) in a selective manner in the contact holes (42a, 42b) with respect to the insulating layer, in order to form electrical contacts on the gates, sources and drains, the electrical contacts on the sources and drains overlapping said lateral insulations.

2. The process according to claim 1, characterized in that the mask (10a) is formed by stacking a first and a second mask material (11, 13), said first mask material (11) being formed directly on the semiconductive layer (8) and being selectively etchable with respect to the first insulant, the semiconductive layer, the second insulating material (26), said spacing strips (24) and the lateral insulations.

3. The process according to claim 1, including the step of selecting the conductive material selectively deposited on the intermediate conductive layer from the group consisting of LPCVD-deposited tungsten, epitaxied silicon, a silicide, platinum, palladium and copper.

4. The process according to claim 1, including the step of selecting the conductive material selectively deposited in the contact holes from the group consisting of LPCVD-deposited tungsten, epitaxied silicon, a silicide, platinum, palladium and copper.

5. The process according to claim 1, including the step of forming the mask (10a) from a $Si_3N_4$ layer (11) and a $SiO_2$ layer (13), the $Si_3N_4$ layer being formed directly on the semiconductive layer.

6. The process according to claim 1, including the step of forming the substrate (2), the semiconductive layer (8) and the epitaxied conductive layer (28a, 28b) of silicon.

7. The process according to claim 6, including the step of forming the intermediate conductive layer of a silicide of a transition metal.

8. The process according to claim 7, including the step of selecting the transition metal from the group consisting of titanium and cobalt.

9. A process for producing an integrated circuit on a semiconductor substrate having MIS transistors, whose sources (18, 32) and drains (20, 34) consist of double junctions and whose gates (8a) are formed in a semiconductive layer (8), said process comprising the following successive steps:
   a) producing lateral electrical insulations (4) of the transistors,
   b) forming a layer of a first insulant (6) at least between the lateral insulations, said first insulant constituting the insulant for the gates (18a) to be formed in the semiconductor layer (8),
   c) depositing, on the structure obtained in step b), said semiconductive layer (8), which can be selectively doped and etched with respect to the lateral insulations, the first insulant and insulating spacing strips (24), d) producing, on the semiconductive layer, a mask (10a) of at least one material which can be selectively etched with respect to the lateral insulations, the insulant, the semiconductive layer, a second insulating material (26) and said spacing strips (24), thereby masking the gates (8a) of the transistors to be produced in the semiconductive layer, e) performing a first implantation (14) of ions at a low dose in the semiconductive layer (8) and in the substrate (2), which are not masked, in order to form in the substrate first source (18) and drain (20) junctions of the transistors, said ions having a conductivity type, f) producing said spacing strips (24) only on the mask (10a) edges, g) etching the semiconductive layer (8) in order to eliminate therefrom the regions not covered by the mask and the spacing strips, thus forming the gates (8a) of the transistors, h) insulating (26) the etched edges of the semiconductive layer with the second insulant, this second insulant being obtained by a chemical reaction with the semiconductive layer which is consumed on its edges, this second insulant and said spacing strips allowing the insulation of the gates from the sources and drains, i) eliminating the mask (10a), j) eliminating the regions of the first insulant bared during step g), k) epitaxy of a conductive layer (28a, 28b) only on the source (18) and drain (20) regions bared during step j) and on the gates (8a) of the transistors, l) performing a second implantation (30) of ions in the epitaxed conductive layer and in the source and drain regions in order to from said double junctions partly in the epitaxed layer and partly in the substrate, said ions having the same conductivity as the ions of the first implantation and said second implantation being made at a higher dose than that of the first implantation, m) depositing a conductive material (38a, 38b) on the epitaxed conductive layer in order to obtain at the end of the process overlapping electrical contacts (44a, 44b) on said source and drain junctions, said conductive material being deposited in a selective manner with respect to the spacing strips (24), the lateral insulations and the second insulant, in order to form gate, source and drain shunts, n) depositing on the complete structure obtained in step m) an insulating layer (40a, 40b), o) forming contact holes (42a, 42b) in said insulating layer facing the gates (8a), the sources (18, 32) and the drains (20, 34) to be connected, and p) depositing a conductive material (44a, 44b) in a selective manner in the contact holes (42a, 42b) with respect to the insulating layer, in order to form electrical contacts on the gates, sources and drains, the electrical contacts on the sources and drains overlapping said lateral insulations.

10. The process according to claim 9, characterized in that the mask (10a) is formed by stacking a first and a second mask material (11, 13), said first mask material (11) being formed directly on the semiconductive layer (8) and being selectively etchable with respect to the first insulant, the semiconductive layer, the second insulating material (26), said spacing strips and the lateral insulations.

11. The process according to claim 9, including the step of selecting the conductive material selectively deposited on the epitaxied conductive layer from the group consisting of LPCVD-deposited tungsten, epitaxied silicon, a silicide, platinum, palladium and copper.

12. The process according to claim 9, including the step of selecting the conductive material selectively deposited in the contact holes from the group consisting of LPCVD-deposited tungsten, epitaxied silicon, a silicide, platinum, palladium and copper.

13. The process according to claim 9, including the step of forming the mask (10a) from a $Si_3N_4$ layer (11) and a $SiO_2$ layer (13), the $Si_3N_4$ layer being formed directly on the semiconductive layer.

14. The process according to claim 9, including the step of forming the substrate (2) and the semiconductive layer (8) of silicon and the epitaxied conductive layer (28) at least partly of a silicide of a transition metal.

15. The process according to claim 14, including the step of selecting the transition metal from the group consisting of titanium and cobalt.

16. The process according to claim 1 wherein, the step of insulating the etched edges is accomplished by thermal oxidation of the semiconductive layer.

17. The process according to claim 9 wherein the step of insulating the etched edges is accomplished by thermal oxidation of the semiconductive layer.

* * * * *